US007902577B2

(12) United States Patent
Kang et al.

(10) Patent No.: US 7,902,577 B2
(45) Date of Patent: Mar. 8, 2011

(54) IMAGE SENSOR HAVING HETEROJUNCTION BIPOLAR TRANSISTOR AND METHOD OF FABRICATING THE SAME

(75) Inventors: Jin Yeong Kang, Daejeon (KR); Sang Heung Lee, Daejeon (KR); Jin Gun Koo, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 105 days.

(21) Appl. No.: 11/872,308

(22) Filed: Oct. 15, 2007

(65) Prior Publication Data
US 2008/0099806 A1 May 1, 2008

(30) Foreign Application Priority Data

Oct. 25, 2006 (KR) ......................... 10-2006-0104170

(51) Int. Cl.
*H01L 31/11* (2006.01)
(52) U.S. Cl. ........... 257/292; 257/E21.053; 257/E21.054
(58) Field of Classification Search .................. 257/292, 257/E31.053, E31.054
See application file for complete search history.

(56) References Cited

U.S. PATENT DOCUMENTS

| 4,107,721 | A | * | 8/1978 | Miller | 257/462 |
| 4,682,203 | A | * | 7/1987 | Konda | 257/291 |
| 5,177,025 | A | * | 1/1993 | Turner et al. | 438/309 |
| 5,323,031 | A | * | 6/1994 | Shoji et al. | 257/198 |
| 5,563,092 | A | * | 10/1996 | Ohmi | 438/485 |
| 5,691,546 | A | * | 11/1997 | Morishita | 257/19 |
| 5,869,857 | A | * | 2/1999 | Chen | 257/292 |
| 6,815,707 | B2 | * | 11/2004 | Sugii et al. | 257/19 |
| 2002/0158313 | A1 | * | 10/2002 | Takagi et al. | 257/593 |
| 2004/0036146 | A1 | * | 2/2004 | Wang et al. | 257/565 |
| 2005/0045804 | A1 | * | 3/2005 | Park et al. | 250/208.1 |
| 2006/0105528 | A1 | * | 5/2006 | Cho et al. | 438/275 |

FOREIGN PATENT DOCUMENTS

JP 05-121535 5/1993
(Continued)

OTHER PUBLICATIONS

Nobuyoshi Tanaka, et al; A 310k Pixel Bipolar Imager (BASIS) IEEE International Solid-State Circuits Conference, Feb. 15, 1989.
Toshio Ogino, et al; "Bipolar Area-Image Sensor;" IEEE Transactions on Electron Devices, vol. ED-29, No. 10, Oct. 1982.

(Continued)

*Primary Examiner* — A. Sefer
*Assistant Examiner* — Allen L Parker
(74) *Attorney, Agent, or Firm* — Ladas & Parry LLP

(57) ABSTRACT

Provided is an image sensor having a heterojunction bipolar transistor (HBT) and a method of fabricating the same. The image sensor is fabricated by SiGe BiCMOS technology. In the image sensor, a PD employs a floating-base-type SiGe HBT. A floating base of the SiGe HBT produces a positive voltage with respect to a collector during an exposure process, and the HBT performs a reverse bipolar operation due to the positive voltage so that the collector and an emitter exchange functions. The SiGe HBT can sense an optical current signal and also amplify the optical current signal. The image sensor requires only three transistors in a pixel so that the degree of integration can increase. The image sensor has an improved sensitivity of signals in the short wavelength region and a sensing signal has excellent linearity such that both a sensing mechanism and control circuit are very simple.

5 Claims, 8 Drawing Sheets

FOREIGN PATENT DOCUMENTS

| | | |
|---|---|---|
| JP | 05-243253 | 9/1993 |
| JP | 08-236614 | 9/1996 |
| JP | 2000-124225 | 4/2000 |
| JP | 2004-128343 | 4/2004 |
| KR | 1019930017199 | 8/1993 |
| KR | 1020010061311 | 7/2001 |
| KR | 1020050069401 | 7/2005 |

OTHER PUBLICATIONS

Yoshio Nakamura, et al; Design of Bipolar Imaging Device (BASIS) IEEE Transactions on Electron Devices, vol. 38, No. 5, May 1991.

Edwin Roks, et al; "A Bipolar Floating Base Detector (FBD) for CCD Image Sensors;" Electron Devices Meeting, 1992, Technical Digest., International Volum, Issue, Dec. 13-16, 1992.

* cited by examiner

IMAGE SENSOR HAVING HETEROJUNCTION BIPOLAR TRANSISTOR AND METHOD OF FABRICATING THE SAME

CROSS-REFERENCE TO RELATED APPLICATION

This application claims priority to and the benefit of Korean Patent Application No. 2006-0104170, filed Oct. 25, 2006, the disclosure of which is incorporated herein by reference in its entirety.

BACKGROUND

1. Field of the Invention

The present invention relates to an image sensor having a heterojunction bipolar transistor (HBT) and, more specifically, to an image sensor in which a complementary metal oxide semiconductor (CMOS) device and a silicon-germanium HBT (SiGe HBT) are mounted on a substrate using SiGe bipolar junction transistor CMOS (SiGe BiCMOS) technology, and a method of fabricating the same.

The image sensor according to the present invention can be more highly integrated than a conventional CMOS image sensor (CIS), and more highly sensitive to signals than when it is fabricated using typical bipolar technology because the amplification rate of signals becomes higher in a floating base reverse-operational mode. Further, the image sensor according to the present invention is excellent in a three-color balance characteristic since a surface SiGe or SiGe carbon (SiGeC) layer disposed on a photo diode (PD) shared with a base is a high-doped p-type layer with a small thickness.

2. Discussion of Related Art

Conventional image sensors may be generally classified as a low-cost CMOS image sensor (CIS) and a high-performance charge-coupled device (CCD) image sensor.

The CCD image sensor is widely used owing to good image quality even in a highly integrated pixel. However, since the CCD image sensor requires a high voltage of 10V or higher, a nanoscale CMOS circuit cannot be easily applied to the CCD image sensor, so it is difficult to make the CCD image sensor highly integrated. Also, fabrication of the CCD image sensor is incompatible with that of typical CMOS devices. Thus, an image sensor module is made bulky because it needs to include at least two chips. Further, the CCD image sensor consumes at least ten times as much power as the CIS due to the high voltage, thus it is not suitable for portable data terminals.

On the other hand, the CIS includes a photo diode (PD) and a transistor in each image pixel like a typical CMOS device, and thus a conventional CMOS semiconductor fabrication process can be applied to fabrication of the CIS without making any changes. Therefore, as compared with the CCD image sensor requiring an additional chip with an image signal processor, the CIS can integrate an image signal processing circuit and an image sensing circuit in a block outside a pixel, operate at a low voltage, and be fabricated at low cost.

A typical CIS with a four-transistor pixel structure is illustrated in FIG. 1. The four-transistor pixel structure includes four transistors. Thus, a unit pixel is comprised of a PD, which is an optical sensor, and four NMOS transistors. Specifically, a transfer transistor serves to transfer photo-charges generated in the PD to a floating diffusion node region (FD), a reset transistor serves to discharge photo-charges stored in the FD or the PD in order to sense signals, a driving transistor serves as a source follower transistor, and a selection transistor is required for switching/addressing operations.

The PD and a capacitor (not shown), which are located thereto, constitute a receiving unit, and the transfer transistor transfers electrons generated by photons to the FD. In order to obtain a two-dimensional image, an electric potential is applied through a gate of the switch transistor to select one column. In particular, each pixel is biased by a current source (not shown), which operates the driving transistor and the selection transistor to read an electric potential at the diffusion node through an output node.

In the last five years, the development of the above-described CIS has progressed in earnest. At present, the CIS is being laboriously developed by Micron, Samsung Electronics, MagnaChip semiconductor, and so on. However, the CIS is being fabricated using CMOS technology in the 180-nm regime, but fabrication of sub-90-nm nanoscale CISs has not yet been attained.

In order to increase the area of the PD of a nanoscale CIS, a variety of methods for reducing the number of required transistors in a pixel and overcoming degradation of signals at low exposure have been proposed. One of the methods is to introduce a bipolar amplification type image sensor.

In the bipolar amplification type image sensor, an optical signal generated in a pn-junction-based PD may be amplified by a normal bipolar transistor or a reverse-operational bipolar transistor in which an emitter and a collector exchange functions using a floating base.

A method using the normal bipolar transistor is advantageous in a gain characteristic, but it has no effect on reducing the area of a pixel because the normal bipolar transistor only replaces a CMOS transistor of a CIS, for amplification use. In contrast, a method using the reverse-operational bipolar transistor can amplify the optical signal on its own, but its gain characteristic is poor. For this reason, the reverse-operational bipolar transistor needs an additional amplifier so that the area of a pixel cannot be reduced.

SUMMARY OF THE INVENTION

The present invention is directed to an image sensor and a method of fabricating the same capable of highly integrating a pixel.

Also, the present invention is directed to an image sensor and a method of fabricating the same capable of reducing the number of transistors in the pixel and preventing degradation of signals at low exposure.

Further, the present invention is directed to an image sensor and a method of fabricating the same capable of highly integrating a pixel without an additional signal amplifier.

In addition, the present invention is directed to an image sensor with an excellent three-color balance characteristic and a method of fabricating the same.

One aspect of the present invention provides an image sensor including: a photo diode (PD) having a cathode connected to a power supply voltage terminal; and a heterojunction bipolar transistor (HBT) having a base connected to an anode of the PD, a collector connected to the cathode of the PD, and an emitter from which an amplified sensing signal is generated.

A surface p-type layer, which forms the anode of the PD, may function as the base of the HBT, while an internal n-type layer, which forms the cathode of the PD, may function as a sub-collector of the HBT.

Another aspect of the present invention provides an image sensor including: a photo diode (PD) having a cathode connected to a power supply voltage terminal; a bipolar transistor having a base connected to an anode of the PD, a collector connected to the cathode of the PD, and an emitter from which an amplified sensing signal is generated; a reset PMOS transistor for connecting the emitter of the bipolar transistor with a ground voltage terminal in response to a reset signal applied to a gate of the reset PMOS transistor; and a selection PMOS transistor for externally transmitting an emitter signal of the bipolar transistor in response to a selection signal applied to a gate of the selection PMOS transistor.

Still another aspect of the present invention provides a method of fabricating an image sensor including: (a) forming a sub-collector of a heterojunction bipolar transistor (HBT); (b) forming a Si epitaxial layer on the sub-collector; (c) forming a collector of the HBT and a well of a complementary metal oxide semiconductor (CMOS) transistor in the Si epitaxial layer; (e) forming a gate insulating layer and a gate layer of the CMOS transistor; (f) forming a base of the HBT; (g) forming a gate of the CMOS transistor; (i) forming an emitter of the HBT; and (j) forming a source and a drain of the CMOS transistor.

The method may further comprise: (d) defining a region where a plug will be formed, which is connected to the sub-collector after step (c) and before step (e); (h) doping impurity ions into regions where the source and drain of the CMOS transistor will be formed after step (g) and before step (i); and (k) forming interconnection lines after step (j).

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

The present invention will now be described more fully hereinafter with reference to the accompanying drawings, in which exemplary embodiments of the invention are shown. This invention may, however, be embodied in different forms and should not be construed as limited to the exemplary embodiments set forth herein.

Embodiment

Figure 2:
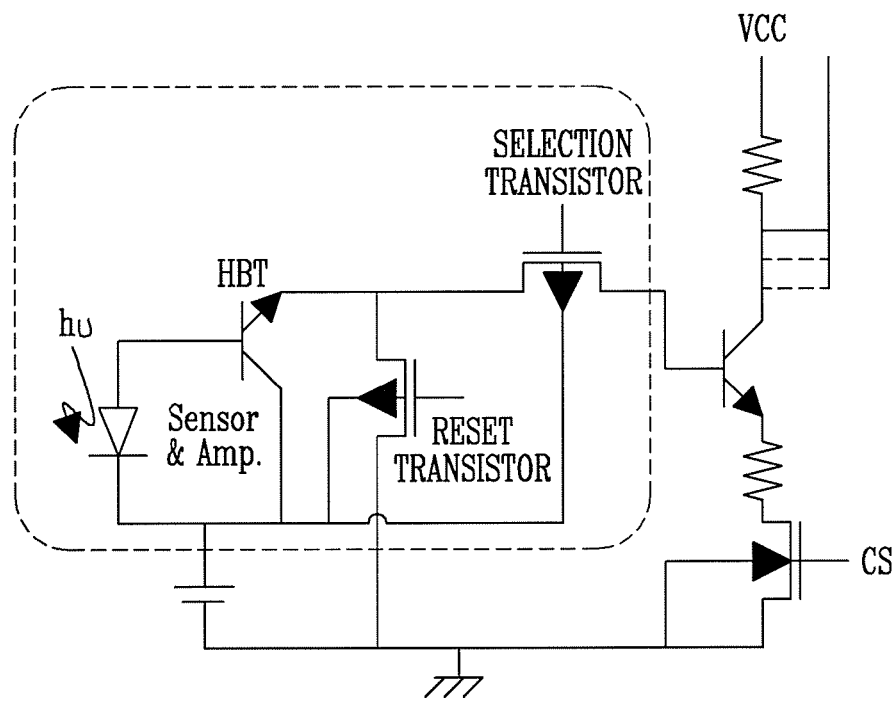
FIG. 2 is a circuit diagram of an image sensor according to an exemplary embodiment of the present invention.

Referring to FIG. 2, an image sensor according to an exemplary embodiment of the present invention includes a photo diode (PD), a heterojunction bipolar transistor (HBT), a reset p-channel metal-oxide semiconductor (PMOS) transistor, and a line selection PMOS transistor. The PD has a cathode connected to a power supply voltage terminal. The HBT has a base connected to an anode of the PD, a collector connected to the cathode of the PD, and an emitter from which an amplified sensing signal is generated. The reset PMOS transistor serves to connect the emitter of the HBT with a ground voltage terminal in response to a reset signal applied to a gate. Also, the line selection PMOS transistor serves to externally transmit an emitter signal from the bipolar transistor in response to a line selection signal applied to the gate.

Noticeably, since it is desirable that the image sensor according to the present exemplary embodiment's fabrication should be based on SiGe BiCMOS technology, the HBT may be a SiGe HBT. According to the SiGe BiCMOS technology, a conventional CMOS device and a SiGe HBT are mounted on a substrate.

The image sensor of the present exemplary embodiment floats a surface p-type layer disposed on a pn-junction by use of an optical signal sensor (i.e., the PD) and connects the floated surface p-type layer with the base of the SiGe HBT. In this case, the surface p-type layer of the PD and the base of the SiGe HBT may be formed using the same layer.

The floated base generates a positive voltage to the collector during exposure. In response to the positive voltage, the SiGe HBT performs a reverse bipolar operation in which the collector and the emitter exchange functions.

Above all, unlike a typical bipolar device, the SiGe HBT has the base with a small bandgap, so that it obtains a current gain ten times as high as that of the typical bipolar device even during the reverse operation. As a result, the SiGe HBT can not only sense an optical (image) signal current but also amplify the optical signal current.

As described above, the PD and the HBT according to the present exemplary embodiment, which are indicated as Sensor & Amp. in FIG. 2, function as not only a sensor but also an amplifier. Thus, as compared with a conventional CIS requiring four transistors (namely, a transfer transistor, a reset transistor, a drive transistor, and a line selection transistor), the image sensor according to the present exemplary embodiment requires only three transistors (namely, the SiGe HBT, the reset PMOS transistor, and the line selection PMOS transistor) in a pixel so that the degree of integration can increase.

Further, the reset transistor and the line selection transistor may not be NMOS transistors but PMOS transistors as shown in FIG. 2, so that the number of contacts can decrease to reduce the area of the pixel.

A floating base of the SiGe HBT may be a SiGe epitaxial layer formed of 80% by weight of Si and 20% by weight of Ge, or a SiGeC epitaxial layer formed of 80% by weight of Si, 20% by weight of Ge, and 0.3% by weight of C, which is doped with p-type impurities, for example boron (B) ions. In an epitaxial growth process for forming the floating base of the SiGe HBT, the concentration of B ions may be easily elevated to $5 \times 10^{18}/cm^3$ or higher (specifically, $5 \times 10^{18}/cm^3$ to $1 \times 10^{19}/cm^3$) even at a low temperature.

The SiGe or SiGeC epitaxial layer may be grown to a very small thickness of 150 Å or less (specifically, 100 to 150 Å). Further, since thermal diffusion of B ions hardly occurs in the SiGe or SiGeC epitaxial layer at a temperature of 700° C. or lower, a pn junction depth can remain small. Thus, loss of signals, which is caused by absorption of most of the signals in the surface of the PD, can be minimized in the short-wavelength blue region. As a result, the sensitivity to the signals can be improved in the short wavelength region, thus easily balancing three colors.

Furthermore, a sensing mechanism according to the present invention is not a so-called transient mechanism, which is dependent on an increase in the number of photo-electrons collected in the PD over time and charge sharing induced along a sensing line, but a direct signal current amplification type mechanism, which amplifies an optical signal current to the HBT and senses signals in a post-reset steady state. Therefore, a sensing signal has excellent linearity, and therefore both the sensing mechanism and a control circuit are very simple.

In addition, a high-quality signal can be obtained even at a low operating voltage ($\approx 1$ V), and the SiGe HBT is used as a circuit element so that a high-quality highly sensitive chip with a great dynamic range can be fabricated, compared with a case where only a CMOS device is used as an analog circuit, such as an analog-to-digital converter (ADC), mounted along with an image sensor SoC.

Since the image sensor according to the present exemplary embodiment requires fewer additional control circuits than a conventional CIS, the image sensor according to the present invention consumes less power. Also, regarding the power consumption of a sensor array sensed in a steady state, although a sensor array of the image sensor according to the present exemplary embodiment consumes more power than that of the conventional CIS during one-time photographing, the sensor array of the image sensor according to the present exemplary embodiment may consume less power than that of the conventional CIS during consecutive photographing, such as the photographing of moving images.

Figure 1:
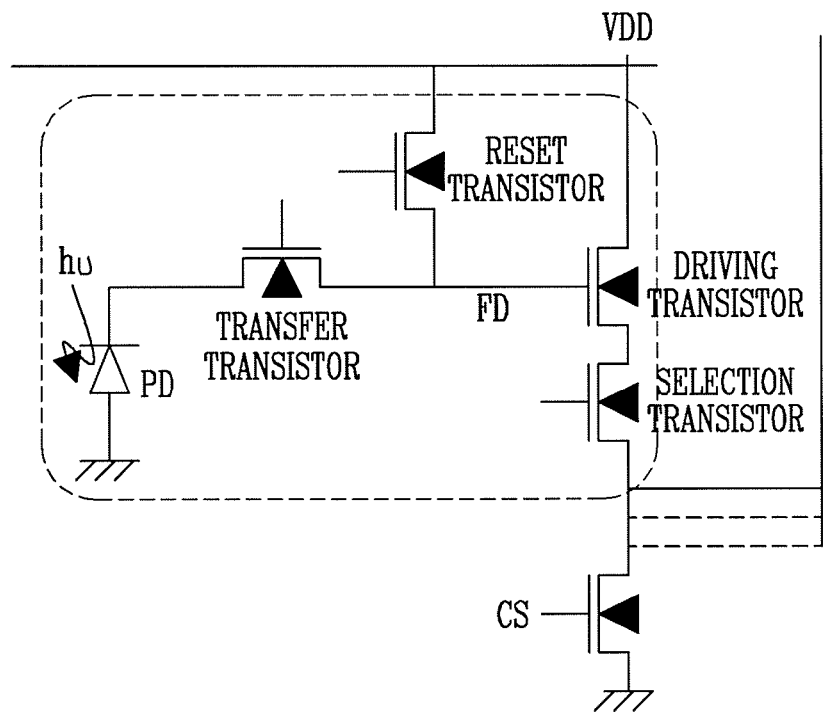
FIG. 1 is a circuit diagram of a conventional image sensor.

The HBT-CMOS image sensor shown in FIG. 2 according to the present exemplary embodiment is compared with the conventional 4-transistor CIS shown in FIG. 1 as shown in the following Table 1.

wall of the trench is thermally oxidized, and an oxide layer is deposited to fill the trench 19. Thereafter, the oxide layer is planarized using a chemical mechanical polishing (CMP) process. In this case, the CMP process is performed using the high-hardness nitride layer, which remains around the trench 19, as an etch stop layer. After that, the resultant structure is thermally treated (with $N_2$ 30 min annealing at 700° C.~950° C.) to make the deposited oxide layer highly dense, and the remaining nitride layer is removed using a wet etching process. In this process, the trench isolation structure is completed.

Figure 8:
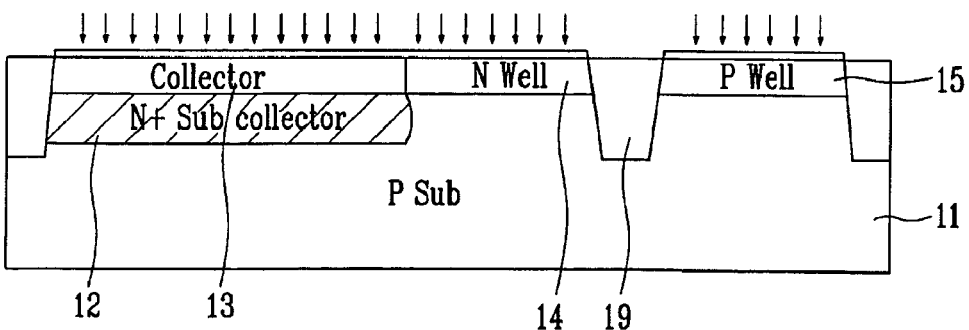

Referring to FIG. 8, in order to form an active layer of the image sensor, ion implantation processes are carried out to form a collector layer 13 of the HBT and well layers 14 and 15 of a CMOS device. Phosphorous (P) ions are doped into a region where the collector layer 13 will be formed and a region where a PMOS well layer 15 will be formed, while B ions are doped into a region where an NMOS well layer 14 will be formed. The ion implantation layers are thermally

TABLE 1

| | Conventional Structure | Structure according to present exemplary embodiment | Comparison between conventional structure/ structure according to present exemplary embodiment in characteristics |
|---|---|---|---|
| Number of transistors | 4 | 3 | Low-density/High-density |
| Number of gates, emitters, and contacts | 9 | 6 | |
| Sensing mode | Precharge/Destructive/Transient state | Real-time/Normal State/Steady State | |
| Sensor/amplifier | Separation of sensor from amplifier | Integration of sensor with amplifier | |
| Blue sensitivity | Defective | Good | Bad/Good in three-color balance |
| Gain | Low | High | Low-sensitivity/High-sensitivity |
| Power Consumption | Low | High | Equal in power consumption during consecutive operation (in moving images) |

Hereinafter, a process of fabricating an image sensor according to an exemplary embodiment of the present invention will be described in detail with reference to FIGS. 3 through 21.

Figure 3:
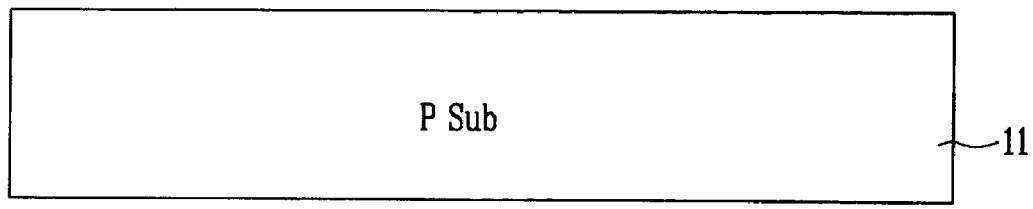
FIGS. 3 through 21 are cross-sectional views illustrating a method of fabricating the image sensor shown in FIG. 2.

Referring to FIG. 3, a Si wafer 11 is prepared. The Si wafer 11 is a p-type substrate, which is doped with B ions to a resistivity of about 6 to 25 Ω·cm.

Figure 4:
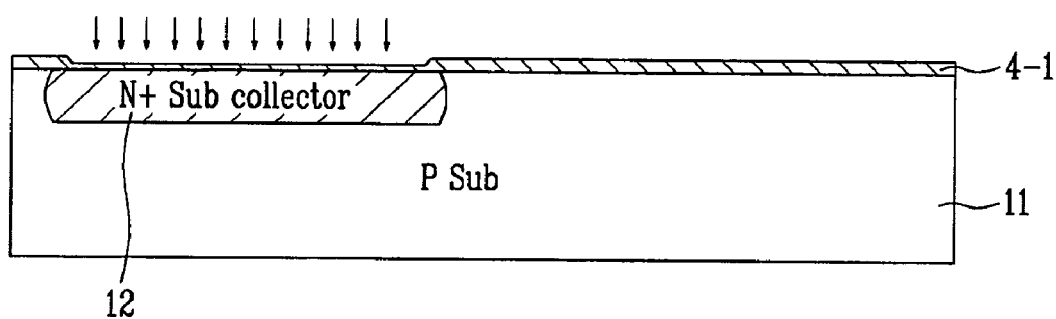

Referring to FIG. 4, a buffer oxide layer 4-1 is grown on the Si wafer 11, and an alignment mark is formed by etching a fiducial mark in order to facilitate a subsequent mask aligning process. Thereafter, an ion implantation process and a thermal diffusion process are performed to form a sub-collector 12 of the SiGe HBT.

Figure 5:
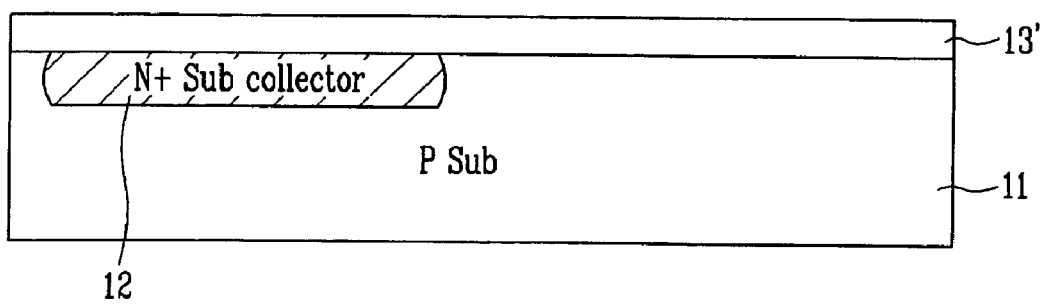

Referring to FIG. 5, the buffer oxide layer 4-1 is removed, and a Si epitaxial layer 13' is grown to form a collector layer of the HBT.

Figure 6:
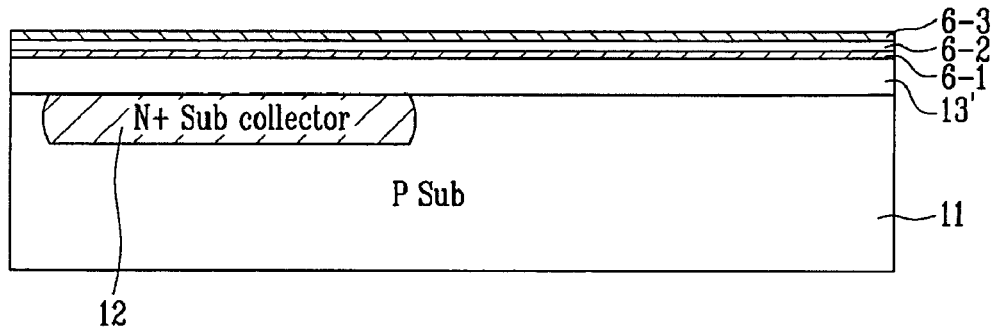

Referring to FIG. 6, in order to form a trench isolation structure, a pad oxide layer 6-1 is grown, a nitride ($Si_3N_4$) layer 6-2 is deposited on the pad oxide layer, and an oxide layer 6-3 for masking a trench is deposited on the nitride layer using a chemical vapor deposition (CVD) process.

Figure 7:
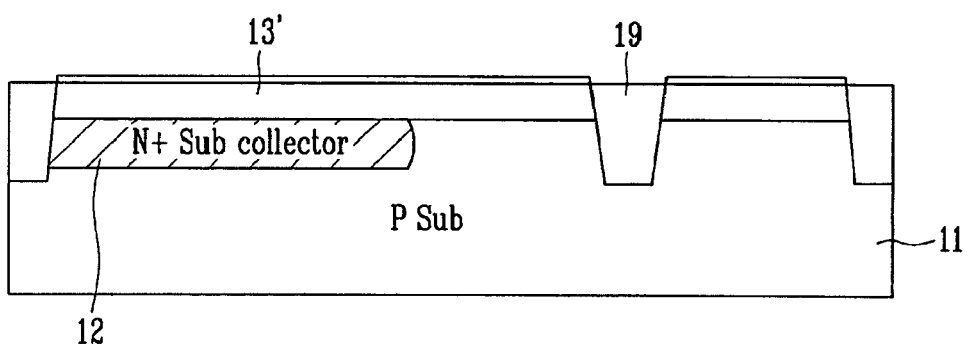

Referring to FIG. 7, the pad oxide layer and the nitride layer in a trench region are patterned, the trench region is etched (preferably, 2 μm~4 μm) to form a trench 19, an inner diffused to an appropriate depth of 1 to 2 μm, thereby forming the collector layer 13 and the NMOS and PMOS well layers 14 and 15.

Figure 9:
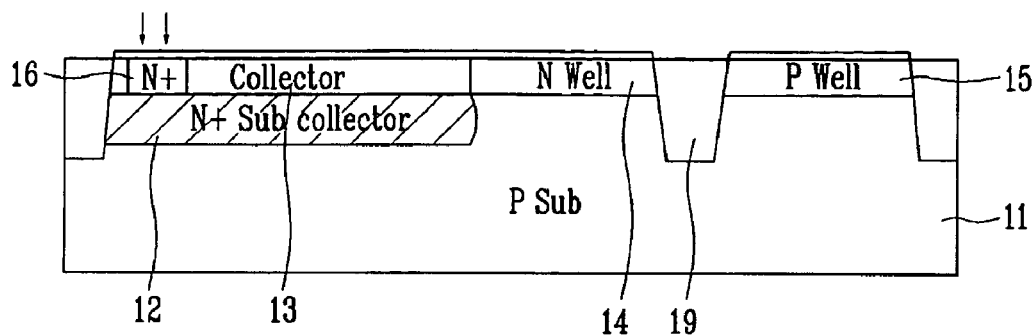

Referring to FIG. 9, P ions are implanted and thermally diffused to form a plug 16, which serves to connect a sub-collector region of the HBT with an external terminal.

Figure 10:
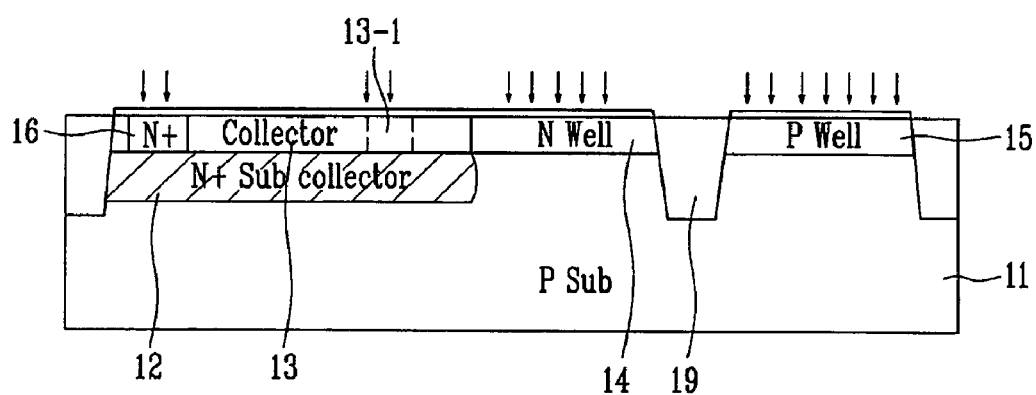

Referring to FIG. 10, P ions are implanted into a region 13-1 in the collector layer 13 in order to elevate a current gain of the HBT. Also, appropriate amounts of B and P ions are implanted into the NMOS well layer 14 and the PMOS well layer 15, respectively, in order to adjust a threshold voltage Vt through a Vt adjusting implantation process.

Figure 11:
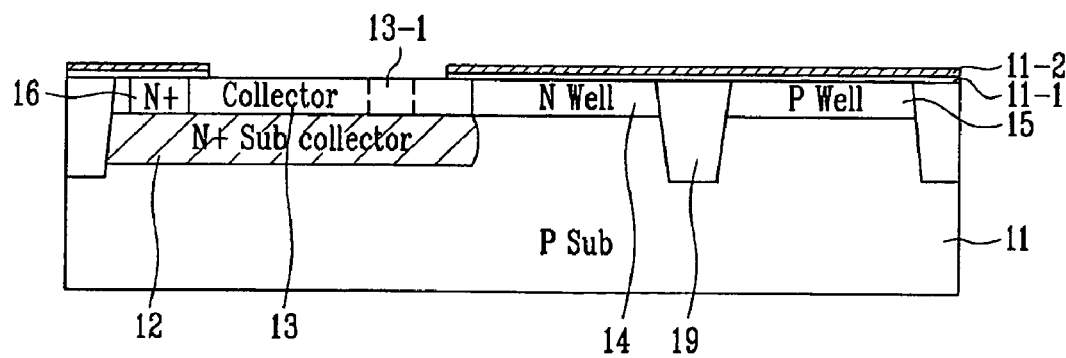

Referring to FIG. 11, the pad oxide layer is removed, a surface of the resultant structure is cleaned, a gate oxide layer 11-1 for a gate insulating layer is grown, and a polysilicon (poly-Si) layer 11-2 is deposited to form a gate of the CMOS device. Afterwards, both the poly-Si layer 11-2 and the gate oxide layer 11-1 are removed from the HBT region to form a base layer that contacts the collector layer 13.

Figure 12:
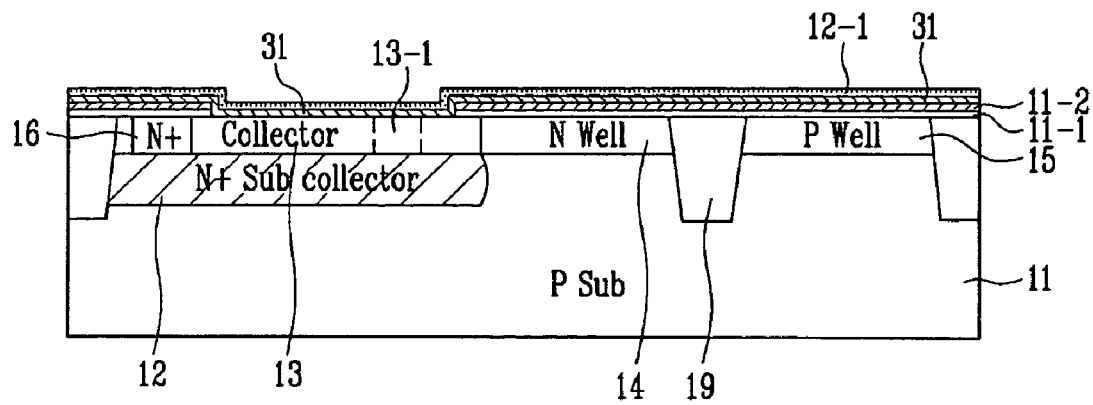

Referring to FIG. 12, a base layer 31 of the HBT, which is an epitaxial layer, is grown on the resultant structure. The base layer 31 may be a SiGe formed of 80% by weight of Si and 20% by weight of Ge or a SiGeC layer formed of 80% by weight of Si, 20% by weight of Ge, and 0.3% by weight of C.

The base layer 31 is doped with p-type impurities, for example boron (B) ions to a concentration of $5\times10^{18}/cm^3$ or higher (preferably, $5\times10^{18}/cm^3 \sim 1\times10^{19}/cm^3$). When the concentration of impurities doped into the base layer 31 is too high, a current gain of a reverse-operational HBT becomes low, and when the concentration of the impurities doped into the base layer 31 is too low, a breakdown voltage of a forward-operational_HBT used in a peripheral circuit becomes low. The base layer 31 includes an epitaxial layer, which is grown on the collector layer 13 that exposes the Si wafer 11, and a polycrystalline layer, which is grown on the poly-Si layer. Thereafter, an oxide layer 12-1 is deposited to protect the base layer 31. In particular, when the base layer 31 is used as a high resistance element on the peripheral circuit, B ions may be additionally implanted into a region where the high resistance element will be formed, in order to reduce resistance deviation.

Figure 13:
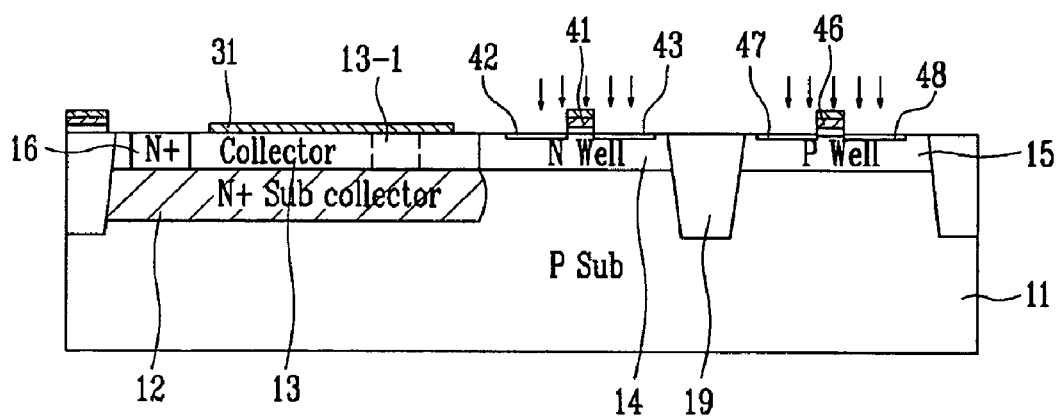

Referring to FIG. 13, the oxide layer for protecting the base layer 31 and the poly-Si layer for forming the gate are patterned to form gates 41 and 46 of the CMOS device. Thereafter, the gate oxide layer, which underlies a region where the gates 41 and 46 are not formed, is removed in order to prepare for performing an ion implantation process in regions where sources and drains 42, 43, 47, and 48 will be formed, on both sides of the gates 41 and 46. Subsequently, a primary doping process is performed using an ion implantation process on the regions where the sources and drains 42, 43, 47, and 48 will be formed. The primary doping process may be a lightly doped drain (LDD) process, which elevates a breakdown voltage and lessens hot carriers to increase the life span of the CMOS device. Afterwards, the oxide layer for protecting the base layer 31 is removed.

Figure 14:
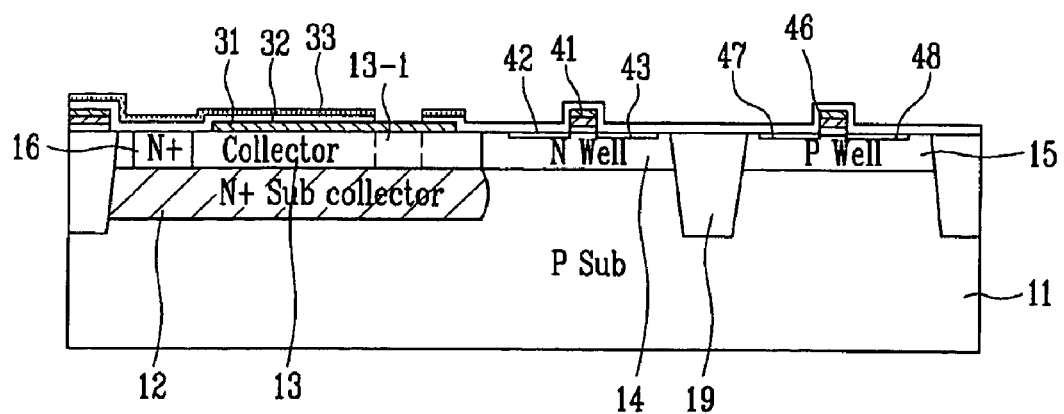

Referring to FIG. 14, a oxynitride (SiON) layer 32 are deposited in order to protect a CMOS region, and an oxide layer 33 is additionally deposited to form a thick border insulating layer between the emitter and base layer 31 of the HBT. Thereafter, the border insulating layer between the emitter and base layer is removed from the CMOS region, and a emitter contact hole is formed using an etching process on the top surface oxide/oxynitride in the region 13-1 of the HBT.

In components of the PD shown in FIG. 14, the base layer 31 becomes a surface p-type layer that functions as an anode, while the sub-collector layer 12 of the HBT becomes an internal n-type layer that functions as a cathode for collecting photo-electrons.

Figure 15:
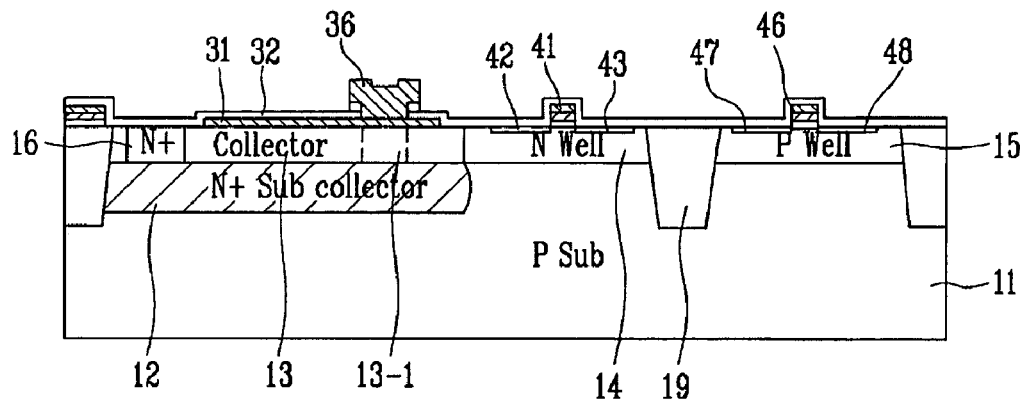

Referring to FIG. 15, a poly-Si layer 36 is deposited and patterned to form the emitter of the HBT, and the border insulating layer, which remains unnecessarily between the emitter and the base layer 31, is removed.

Figure 16:
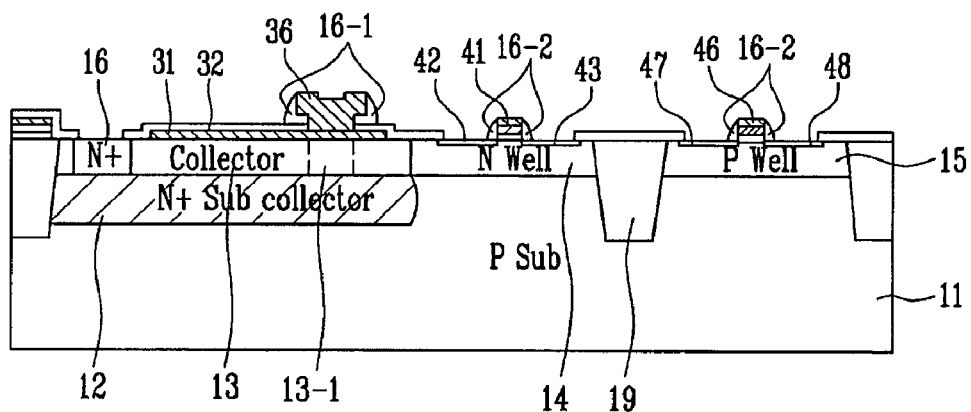

Referring to FIG. 16, a silicon-oxide ($SiO_2$) layer for the emitter of the HBT is deposited on the resultant structure. This silicon oxide layer is removed from the CMOS region, and an emitter region of the HBT is vertically etched to form a silicon oxide ($SiO_2$) sidewall 16-1. Thereafter, a CMOS gate region is vertically etched to form a silicon-oxynitride (SiON) sidewall 16-2. The oxide layer on the plug 16 is removed during this formation of the $SiO_2$ sidewall and the SiON sidewall. The $SiO_2$ sidewall 16-1 is a gate sidewall insulating layer that serves to increase an insulating characteristic between the emitter 36 and the base layer 31, while the SiON sidewall 16-2 is a gate sidewall insulating layer that serves to increase an insulating characteristic between the gates 41 and 46 and the sources/drains 42, 43, 47, and 48.

Figure 17:
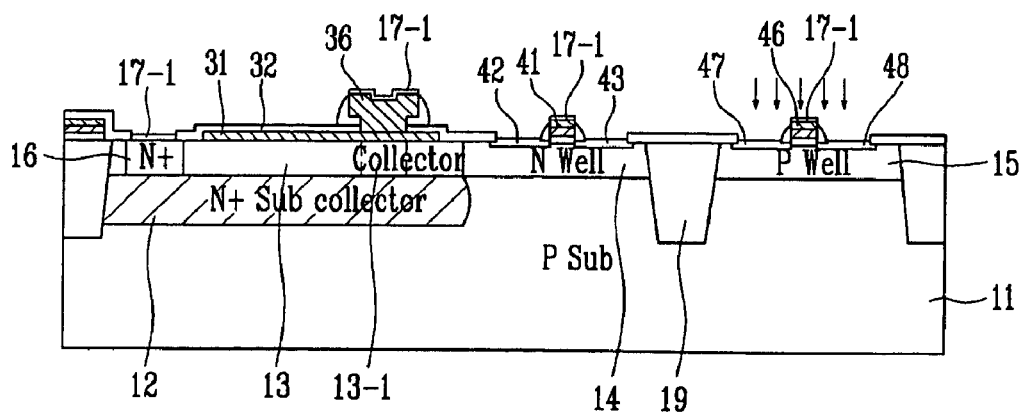

Referring to FIG. 17, a SiGe epitaxial layer 17-1 is further grown on the plug 16 for external connection and the gates 41 and 46 and the sources/drains 42, 43, 47, and 48 in order to increase the thickness of a semiconductor layer. This process may be optionally performed to reduce the resistance of a portion connected to the external terminal and further reduce the resistance of a silicide layer that will be formed in a subsequent process.

Figure 18:
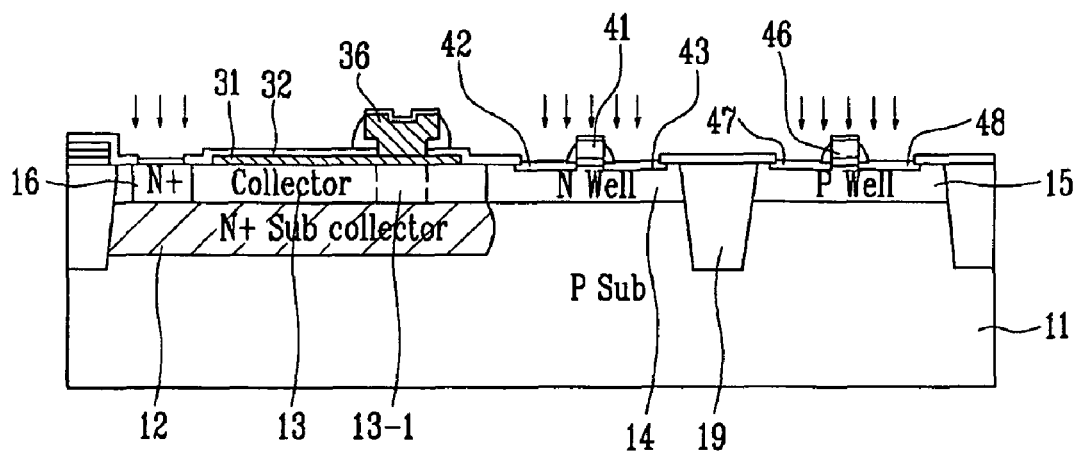

Referring to FIG. 18, impurity ions are heavily doped into regions on both sides of the gates 41 and 46, thereby forming regions of sources/drains 42, 43, 47, and 48.

Figure 19:
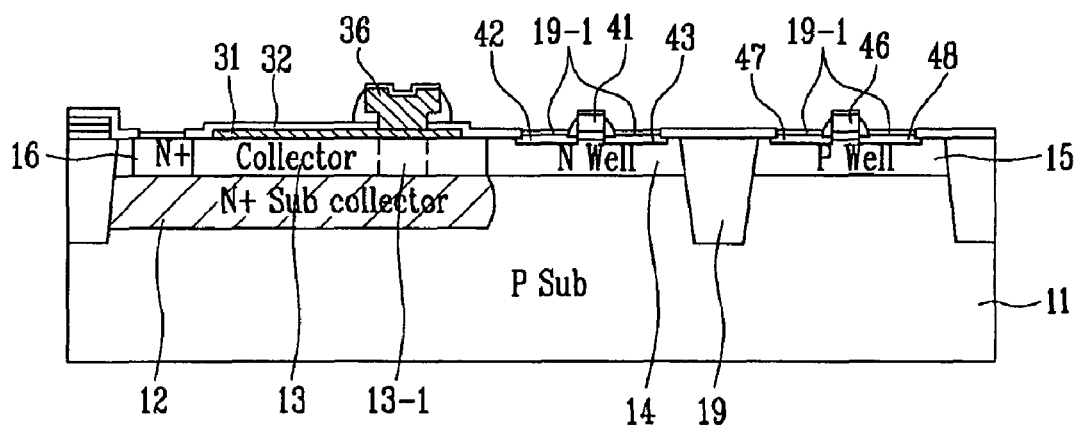

Referring to FIG. 19, a Co/Ti/TiN layer is deposited and primarily thermally treated at a low temperature using a rapid thermal processing (RTP) apparatus to form a first silicide layer in order to lower the resistance of silicon or poly-Si doped in the gates, sources, and drains 41, 46, 42, 43, 47, and 48. Thereafter, the remaining Co/Ti/TiN layer, which is not used to form the first silicide layer, is removed using a wet etching process. Finally, the resultant structure is secondarily thermally treated at a high temperature so that a second silicide ($CoSi_2$) layer 19-1 is selectively formed only in a region where the Si layer or the poly-Si layer is exposed.

Figure 20:
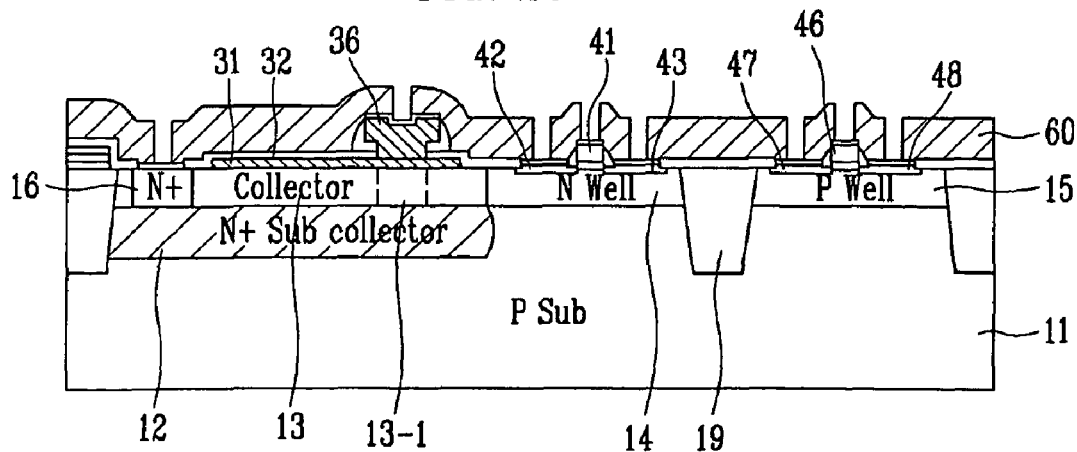

Referring to FIG. 20, an interlayer dielectric oxide layer 60 is deposited, and a contact opening is formed between the semiconductor layer and a metal interconnection layer that will be formed later.

Figure 21:
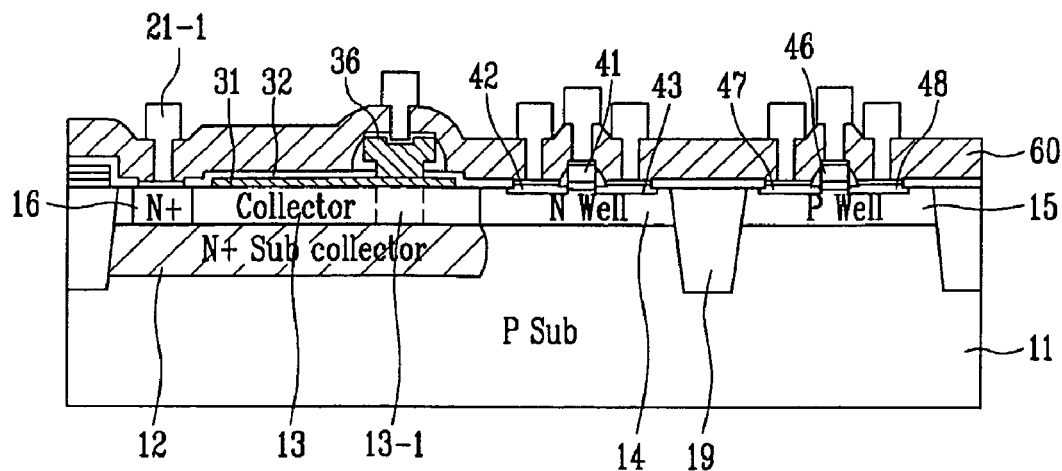

Referring to FIG. 21, an Al/Ti/TiN layer is deposited and patterned to form metal interconnection lines 21-1, thereby completing the CIS.

Figure 22:
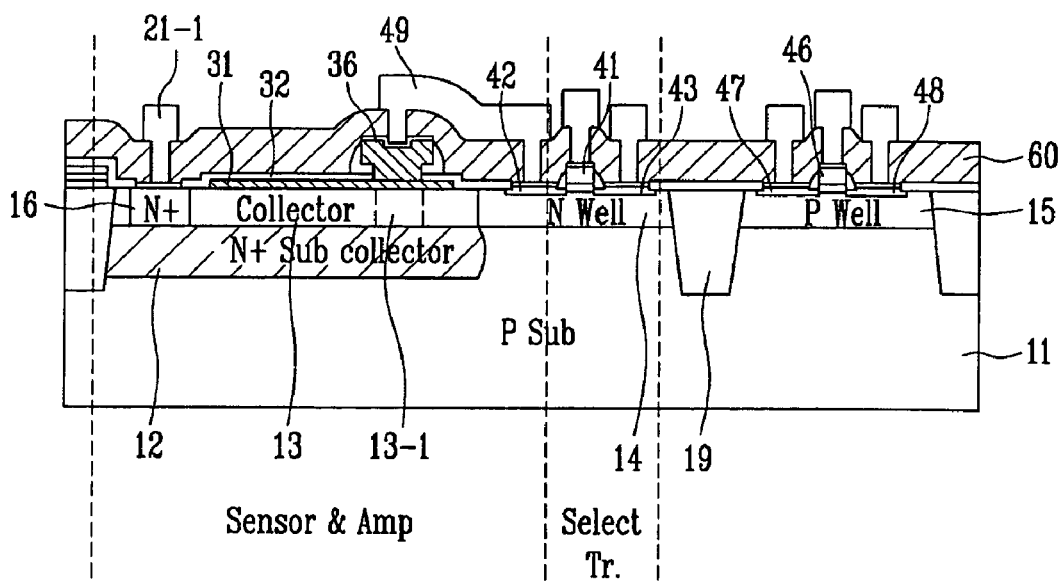
FIG. 22 is a cross-sectional view showing the use of the completed image sensor shown in FIG. 21.

FIG. 22 illustrates the operation of the completed image sensor. As shown in FIG. 22, the emitter of the HBT is connected to the drain (or source) of the selection transistor using a metal layer or a polycrystalline layer 49.

According to the present invention as described above, a reverse-operational bipolar image sensor including a floating base can be fabricated by use of an HBT (particularly, a SiGe HBT). As a result, the following effects can be obtained.

First, when an image optical signal is incidental to a sensor in which a PD is combined with an HBT, a current gain is high even in a reverse-operation in which an emitter and a collector exchange functions, so that an optical signal current can be amplified. Therefore, the image optical signal can be not only sensed but also amplified. Since the sensor can further perform the amplification function, the image sensor according to the present invention requires only three transistors in a pixel, in comparison with a CIS requiring four transistors in a pixel, and can be highly integrated.

Second, a SiGe or SiGeC base layer of an HBT can be expanded and used along with a surface junction p-type layer disposed on the PD, thus reducing the entire area. Also, the base layer can be formed to a very small thickness of 150 Å or less and to a concentration of $5\times10^{18}/cm^3$ or higher, and B ions are barely thermally diffused due to the properties of the SiGe or SiGeC layer, so that a pn junction depth can remain small. As a result, the generation of dark current is inhibited in the PD, and quantum collection efficiency in a short wavelength blue region can be remarkably enhanced compared with in a typical Si semiconductor device.

Third, since the image sensor according to the present invention is a direct signal current amplification type mechanism that amplifies an optical signal current to an HBT and senses the optical signal current in a steady mode, a sensing signal has excellent linearity and therefore both a sensing mechanism and control circuit are very simple.

Fourth, a high-quality signal can be obtained even at a low operating voltage ($\approx 1V$), and a circuit element employs a SiGe HBT instead of a CMOS device or bipolar transistor, so that a high-quality highly sensitive chip with a great dynamic range in an analog circuit can be fabricated.

Fifth, the image sensor according to the present invention uses both the reset transistor and the selection transistor that are PMOS transistors, thus minimizing the area of a pixel.

In the drawings and specification, there have been disclosed typical preferred embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. An image sensor comprising:
   a photo diode (PD) configured to receive an image optical signal to generate a first optical current having a cathode connected to a power supply voltage terminal;
   a heterojunction bipolar transistor (HBT) having
      a floating SiGe base,
      a Si collector, and
      a Si emitter,
   the floating SiGe base connected to an anode of the PD,
   the Si collector connected to the cathode of the PD, and
   the Si emitter from which an amplified sensing signal is generated;
   a reset PMOS transistor for connecting the emitter of the HBT with a ground voltage terminal in response to a reset signal applied to a gate of the reset PMOS transistor; and
   a selection PMOS transistor for externally transmitting an emitter signal of the HBT in response to a selection signal applied to a gate of the selection PMOS transistor,
   wherein the image sensor is configured to function as a pixel formed by the HBT, the reset PMOS transistor, and the selection PMOS transistor,
   wherein HBT is configured to sense and amplify the first optical current while the image sensor performs as the pixel, and
   wherein the base of the HBT is configured to generate the first optical current when the image optical signal is incident to the PD, and
   wherein the base of the HBT is configured to amplify and generate a high current in a reverse bipolar operation from the image optical signal being incident to the PD.

2. The image sensor according to claim 1, wherein a surface p-type layer, which forms the anode of the PD, functions as the base of the HBT.

3. The image sensor according to claim 1, wherein an internal n-type layer, which forms the cathode of the PD, functions as a sub-collector of the HBT.

4. The image sensor according to claim 2, wherein the surface p-type layer is doped with boron (B) ions to a concentration greater than or equal to $5\times10^{18}/cm^3$ and less that or equal to $1\times10^{19}/cm^3$, and has a thickness no greater than 150 Å and not less than 100 Å.

5. The image sensor according to claim 2, wherein the surface p-type layer is a thin epitaxial layer or a thin polycrystalline layer, and
   wherein the thin epitaxial layer or the thin polycrystalline layer is formed of one of $p^+$ SiGe or $p^+$ SiGeC.

* * * * *